United States Patent
Bhatti et al.

(10) Patent No.: US 7,213,636 B2
(45) Date of Patent: May 8, 2007

(54) COOLING ASSEMBLY WITH IMPINGEMENT COOLED HEAT SINK

(75) Inventors: Mohinder Singh Bhatti, Amherst, NY (US); Shrikant Mukund Joshi, Williamsville, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/080,012

(22) Filed: Mar. 15, 2005

(65) Prior Publication Data

US 2006/0207746 A1  Sep. 21, 2006

(51) Int. Cl.
*F28F 7/00* (2006.01)
*F28D 15/00* (2006.01)
*H05K 7/20* (2006.01)

(52) U.S. Cl. .................. 165/80.4; 165/104.33

(58) Field of Classification Search ...... 165/80.3–80.4, 165/104.33, 908; 361/698, 699; 257/714
See application file for complete search history.

(56) References Cited

U.S. PATENT DOCUMENTS

| | | | | |
|---|---|---|---|---|
| 4,884,630 A | * | 12/1989 | Nelson et al. | 165/170 |
| 4,940,085 A | * | 7/1990 | Nelson et al. | 165/80.3 |
| 4,977,444 A | * | 12/1990 | Nakajima et al. | 257/714 |
| 5,021,924 A | * | 6/1991 | Kieda et al. | 361/699 |
| 5,132,780 A | * | 7/1992 | Higgins, III | 257/722 |
| 5,304,846 A | | 4/1994 | Azar | 257/722 |
| 5,349,831 A | * | 9/1994 | Daikoku et al. | 62/376 |
| 5,987,892 A | * | 11/1999 | Watanabe et al. | 62/3.7 |
| 6,105,373 A | * | 8/2000 | Watanabe et al. | 62/3.7 |
| 6,422,307 B1 | | 7/2002 | Bhatti | 165/185 |

* cited by examiner

*Primary Examiner*—Tho Duong
(74) *Attorney, Agent, or Firm*—Patrick M. Griffin

(57) ABSTRACT

The subject invention provides a cooling assembly for removing heat from an electronic device. The cooling assembly includes a heat sink having a base plate and a plurality of fins extending upwardly from the base plate to a top extremity. A nozzle directs a flow of cooling fluid onto the fins and is disposed above the base plate and below the top extremity of the fins. The flow of cooling fluid is discharged from the nozzle adjacent the base plate and then flows upwardly through the fins to remove the heat from the base plate before removing any heat from the fins.

11 Claims, 4 Drawing Sheets

DISTANCE FROM CENTER OF NOZZLE

COOLING ASSEMBLY WITH IMPINGEMENT COOLED HEAT SINK

BACKGROUND OF THE INVENTION

1. Field of the Invention

The subject invention relates to a cooling assembly for cooling an electronic device such as a microprocessor or a computer chip.

2. Description of the Prior Art

These electronic devices generate a high concentration of heat, typically a power density in the range of 5 to 35 W/cm$^2$. Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm$^2$. However, the increased computing speeds have resulted in a corresponding increase in the power density of the electronic devices in the order of 20 to 35 W/cm$^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat form the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm$^2$.

The amount of heat transferred between the heat sink and the cooling fluid is dependent upon a heat transfer coefficient therebetween. The heat transfer coefficient is dependent upon a temperature gradient between the heat sink and the cooing fluid, with the higher heat transfer coefficient corresponding to higher temperature gradients, i.e., the higher the temperature gradient between the heat sink and the cooling fluid, the more heat the cooling fluid will remove. The amount of heat stored in the base plate and each of the fins varies according to the distance from the heat source, with the highest concentration of heat occurring directly above the heat source in the base plate.

The U.S. Pat. No. 5,304,846 issued to Azer et. al., and the U.S. Pat. No. 6,422,307 issued to Bhatti et. al., each disclose a heat sink for a LCU. The heat sink assemblies include a base plate with a plurality of fins having smooth sidewalls extending upwardly from the base plate. In operation, the fins absorb heat through the base plate, with less heat being absorbed the farther the fin gets from the heat source. The cooling fluid is introduced into the heat sink at the outer periphery thereof, either parallel to or impinging on the fins. The flow of cooling fluid absorbs a portion of the heat from the outer periphery of the heat sink before contacting the highest heat concentration in the heat sink. The heat absorbed from the outer periphery of the heat sink increases the temperature of the cooling fluid, thereby lowering the temperature gradient between the cooling fluid and the heat sink when the cooling fluid finally arrives at the highest concentration of heat in the heat sink, thereby decreasing the efficiency of the heat sink.

SUMMARY OF THE INVENTION AND ADVANTAGES

The subject invention provides a cooling assembly for removing heat from an electronic device. The assembly includes a pump for circulating a flow of cooling fluid and a heat exchanger for removing the heat from the flow of cooling fluid. A heat sink transfers the heat from the electronic device to the flow of cooling fluid, and includes a base plate for engaging the electronic device. The base plate has a top surface and a plurality of fins in spaced and parallel relationship extending upwardly from the top surface of the base plate a pre-determined height to a top extremity. A nozzle defining an exit directs the flow of cooling fluid into the plurality of fins, with the exit of the nozzle being disposed below the top extremity of the plurality of fins for discharging the flow of cooling fluid adjacent the top surface of the base plate.

Accordingly, the subject invention provides an improved cooling assembly with the nozzle disposed in close proximity to the base plate of the heat sink so that the flow of cooling fluid is discharged adjacent the base plate for removing the heat from the base plate, which has the highest concentration of heat. The flow of cooling fluid then circulates upward through the plurality of fins, removing the remaining heat from the fins as the cooling fluid flows past. Therefore, the subject invention increases the temperature gradient between the highest concentration of heat in the base plate, which is over the electronic device, and the flow of cooling fluid, thereby increasing the efficiency of the heat sink.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicates like or corresponding parts throughout the several views; a heat sink is generally shown at 20.

Figure 1:
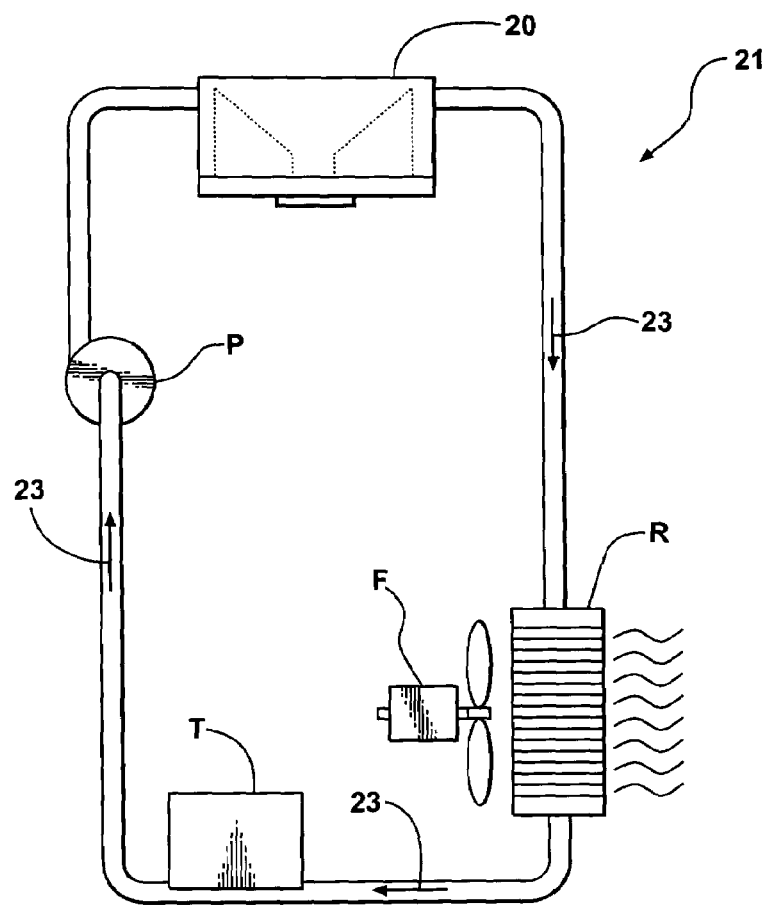
FIG. 1 is a schematic view of a liquid cooling assembly.

Referring to FIG. 1, the heat sink 20 is incorporated into a liquid cooling assembly generally shown at 21 in FIG. 1. A working fluid mover, such as a pump P, moves the flow of cooling fluid 23, usually a liquid, through a cooling fluid storage tank T, which stores excess cooling fluid 23. The pump P moves the cooling fluid 23 through a heat extractor to dissipate the heat from the cooling fluid 23. The heat extractor includes a fan F and a radiator R. The radiator R can be of the well known type including tubes with cooling tins between the tubes to exchange heat between the cooling fluid 23 passing through the tubes and air forced through the radiator R by the fan F.

Referring to FIGS. 2 through 6, the heat sink 20 includes a base plate 22 having a bottom surface 24 for engaging an electronic device 26 thereon. The base plate 22 includes a top surface 28, with a plurality of fins 30 in spaced and parallel relationship extending upwardly from the top surface 28 of the base plate 22 a pre-determined height to a top extremity 32. The fins 30 define a notch, generally shown at 34 in FIG. 3, which bisects the fins 30. The notch 34 includes a first vertical wall 36 and a second vertical wall 38 in spaced relationship and perpendicular to the top surface 28 of the base plate 22 and extending upwardly from the top surface 28 of the base plate 22 to define a rectangular shape.

In the preferred embodiment, a first angled wall 40 extends upwardly from a first intersection 42 with the first vertical wall 36 to the top extremity 32, and a second angled wall 44 extends upwardly from a second intersection 46 with the second vertical wall 38 to the top extremity 32. The first angled wall 40 and the second angled wall 44 diverge from each other as they extend upwardly from the first vertical wall 36 and second vertical wall 38 respectively. The first intersection 42 and the second intersection 46 are disposed a pre-determined distance above the top surface 28 of the base plate 22. While the preferred embodiment of the heat sink 20 includes the first and second angled walls 40, 44, the first and second angled walls 40, 44 are not necessary for the heat sink 20 of the subject invention to operate. Accordingly, an alternative embodiment of the heat sink is shown generally at 120 in FIG. 7, in which the first and second angled walls 40, 44 are omitted.

The electronic device 26 generates an amount of heat to be dissipated, the heat being transferred from the electronic device 26 to the bottom surface 24 of the base plate 22 of the heat sink 20. The heat is then conducted from the base plate 22 to the fins 30. A nozzle 50 discharges an impinging flow of cooling fluid 23 for removing the heat from the heat sink 20 as it circulates therethrough.

The nozzle 50 is disposed within the notch 34 and defines an exit 54 for directing the flow of cooling fluid 23 into the fins 30. The exit 54 of the nozzle 50 is disposed below the top extremity 32 of the fins 30 for discharging the flow of cooling fluid 23 adjacent the top surface 28 of the base plate 22. This orientation of the nozzle 50, in close proximity to the base plate 22, provides for a higher temperature gradient between the flow of cooling fluid 23 and the highest concentration of heat, which occurs at the base plate 22 directly above the heat source (the electronic device 26).

Figure 2:
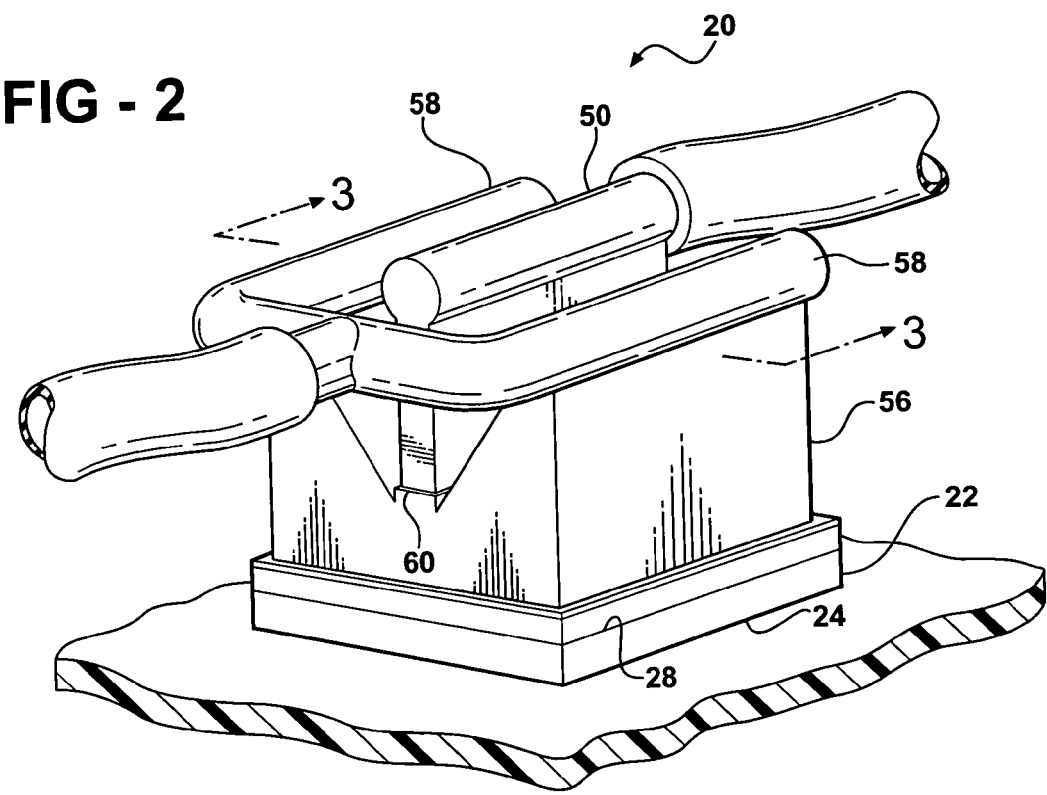
FIG. 2 is a perspective view of the heat sink and the nozzle of the cooling assembly.
Figure 3:
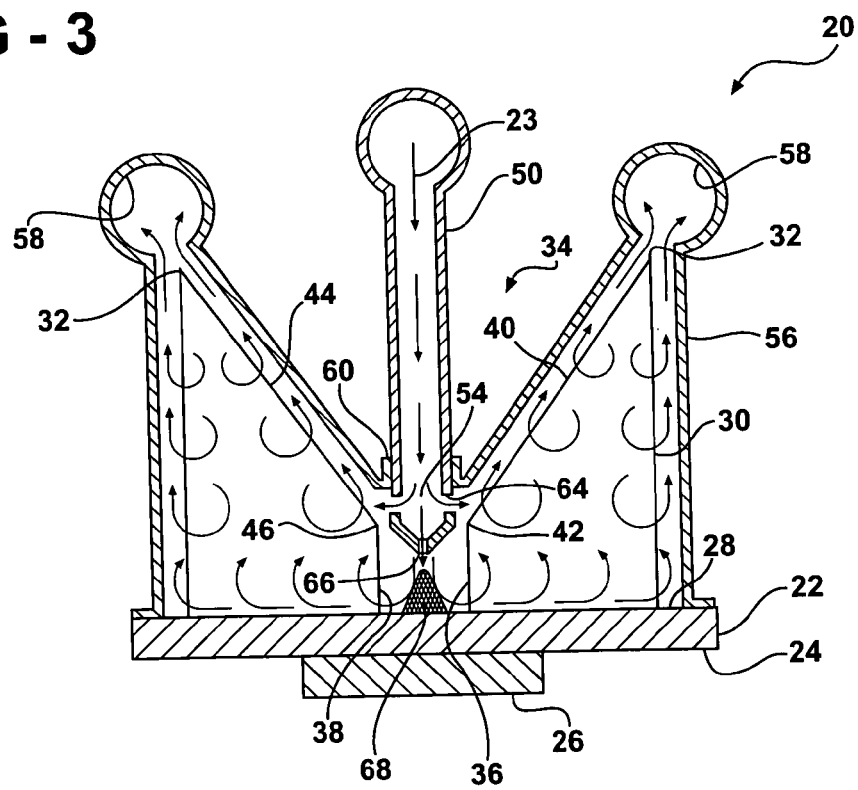
FIG. 3 is a cross-sectional view of the heat sink along cut line 3—3 of FIG. 2.

Referring to FIGS. 2 and 3, the heat sink 20 includes a cap 56, which encapsulates the fins 30 between the cap 56 and the base plate 22. The cap 56 defines at least one outlet 58 disposed above the top extremity 32 of the fins 30 for exhausting the flow of cooling fluid 23. As shown, the cap 56 includes two outlets 58 disposed on opposite sides of the nozzle 50 above the top extremity 32. The cap 56 further includes an access port 60 for receiving the nozzle 50 therethrough.

Figure 4:
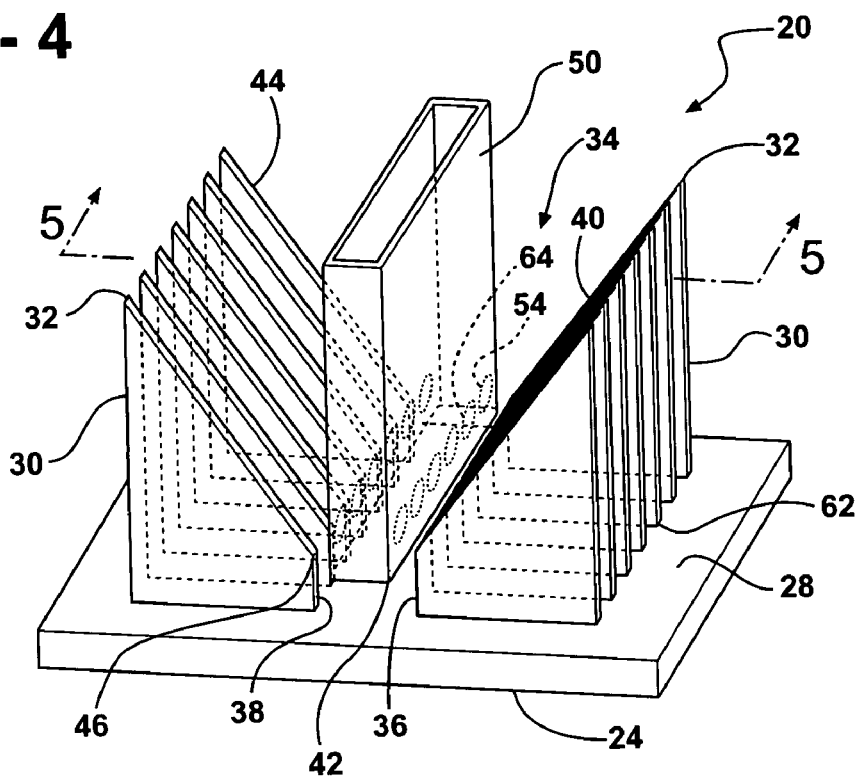
FIG. 4 is a perspective view of the heat sink without the cap.

Referring to FIGS. 3 and 4, the fins 30 define a plurality of parallel flow channels 62 therebetween. The exit 54 in the nozzle 50 includes at least one side opening 64 for discharging the flow of cooling fluid 23 into the plurality of parallel channels 62. The flow of cooling fluid 23 is discharged from the nozzle 50 through the side openings 64, adjacent the base plate 22. The flow of cooling fluid 23 then circulates upward through the parallel flow channels 62 to the outlet 58.

Optionally, as shown in FIG. 3, the exit 54 may include at least one basal opening 66 in the nozzle 50 for discharging the flow of cooling fluid 23 perpendicularly onto the top surface 28 of the base plate 22, with the heat sink 20 including at least one pyramid fin 68 extending upwardly from the top surface 28 of the base plate 22. The pyramid fin 68 is aligned with the basal opening 66 such that the basal opening 66 discharges the flow of cooling fluid 23 onto the pyramid fin 68.

Figure 6:
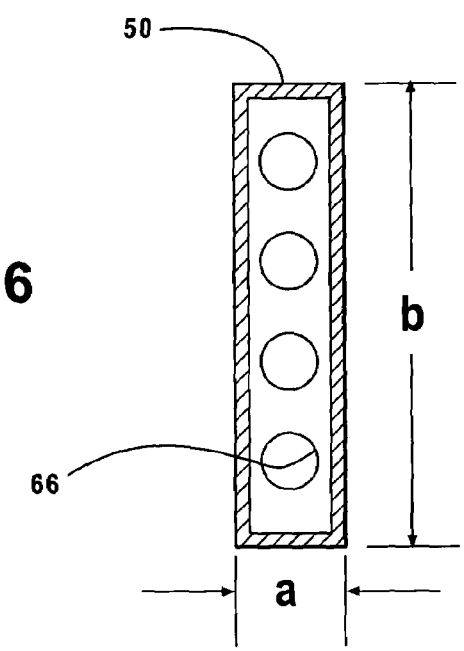
FIG. 6 a cross-sectional view of the nozzle along cut line 6—6 of FIG. 5.
Figure 5:
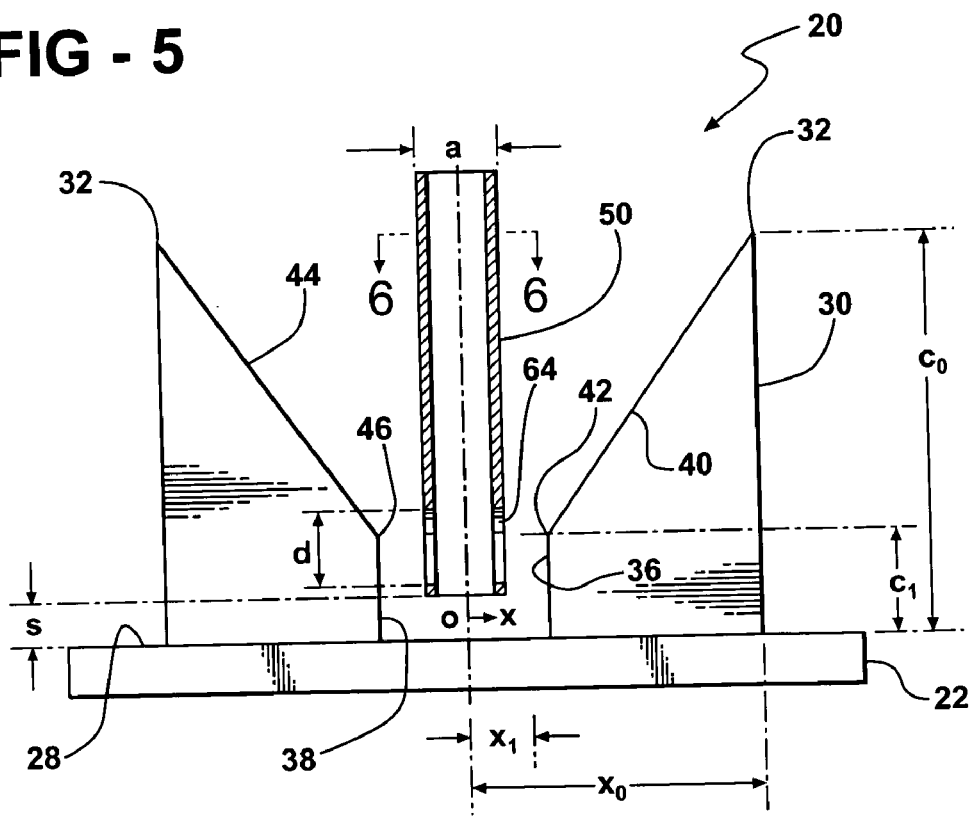
FIG. 5 is a cross-sectional view of the heat sink shown in FIG. 4 along cut line 5—5.
Figure 7:
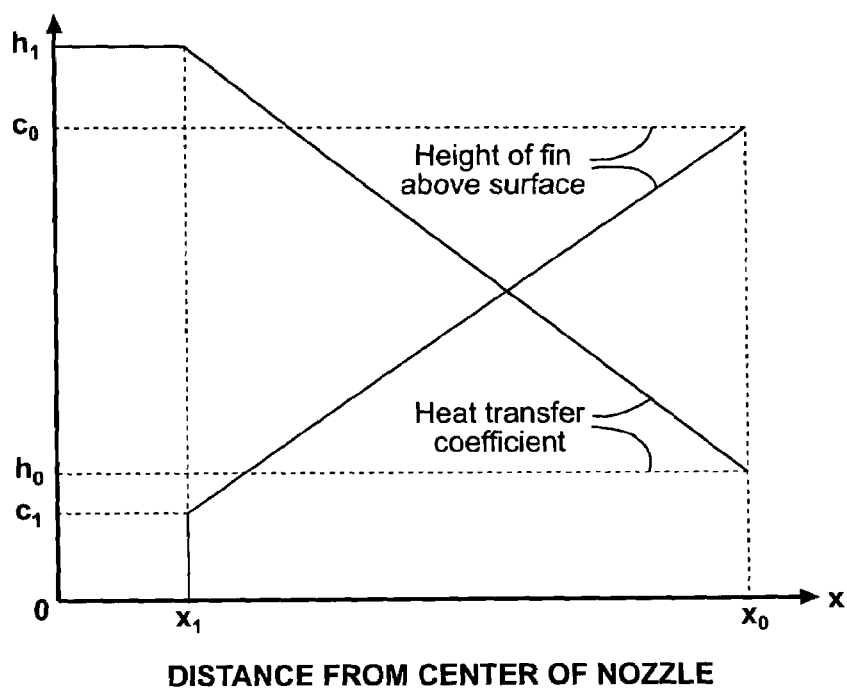
FIG. 7 is a graph showing the relationship between the heat transfer coefficient and the fin height of the heat sink with respect to the distance from the heat source.
Figure 8:
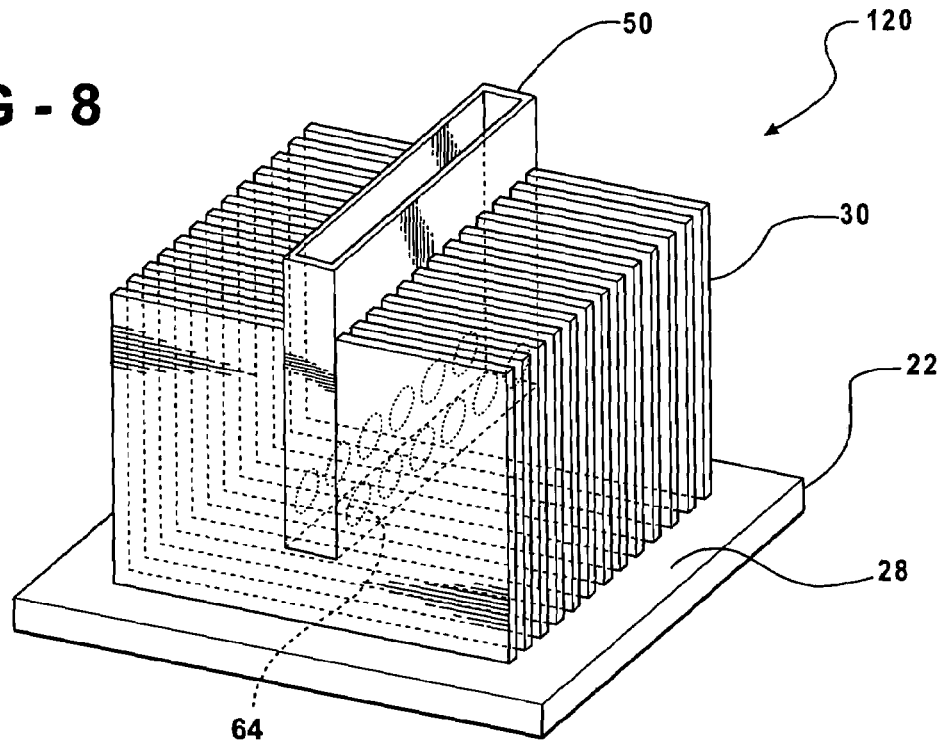
FIG. 8 a perspective view of an alternative embodiment of the heat sink without the cap.

Referring to FIGS. 5 through 7, certain variables are shown, which will be referenced by equations described below. The equations are used to describe the critical dimensions of the heat sink 20 and the nozzle 50. Accordingly, the following variables shown in the Figures have the following definitions: where "a" is the width of the nozzle 50; "b" is the length of the nozzle 50 perpendicular to the fins 30; "c" is the height of the fins 30, with the subscript "i" denoting the inner edge of the fins 30 at the first or second vertical walls 36, 38 and the subscript "o" denoting the uppermost edge of the fins 30 at the top extremity 32; "x" is the distance from the center of the nozzle 50 and parallel to the base plate 22, with the subscript "i" denoting the inner edge of the fins 30 at the first or second vertical walls 36, 38 and the subscript "o" denoting the outermost edge of the fins 30, farthest from the nozzle 50; "s" is the distance between the nozzle 50 and the top surface 28 of the base plate 22; "d" is the diameter of the side openings 64 in the nozzle 50; "h" is the heat transfer coefficient between the cooling fluid 23 and the heat sink 20, with the subscript "i" denoting the inner edge of the fins 30 at the first or second vertical walls 36, 38 and the subscript "o" denoting the outermost edge of the fins 30, farthest from the nozzle 50.

The nozzle 50 includes a rectangular cross-section and a hydraulic diameter ($d_h$) defined by the equation:

$$d_h = \frac{2ab}{a+b} \quad (1)$$

The preferred values of the hydraulic diameter ($d_h$) are in the range of 0.02 in $\leq d_h \leq$ 0.08 in (0.5 mm $\leq d_h \leq$ 2 mm).

The heat transfer rate between the heat sink 20 and the flow of cooling fluid 23 increases as the nozzle 50 encroaches the top surface 28 of the base plate 22. This is because as the nozzle 50 is brought closer to the top surface 28 of the base plate 22, the free jet region of the flow of cooling fluid 23 diminishes, and as a result, the flow velocity of the impinging jet flow of cooling fluid 23 is higher. The preferred spacing(s) of the nozzle 50 from the top surface 28 of the base plate 22 is expressible in terms of the hydraulic diameter ($d_h$) of the nozzle 50, and is preferably in the range of $0.1 \leq s/d_h \leq 1$.

The side openings 64 in the nozzle 50 include a diameter (d) that is expressible in terms of the width (a) and length (b) of the nozzle 50, and are preferably in the range of $0.2\sqrt{ab} \leq d \leq \sqrt{ab}$.

The fins 30, as shown in the preferred embodiment of the heat sink generally shown at 20 in FIGS. 1 through 4, includes a height (c). The variable height (c) of the fins 30 is influenced by the consideration that the heat transfer coefficient (h) is higher at the point of impingement of the cooling fluid 23 (x=0) and drops off more or less linearly away from the point of impingement (x>0) as shown in FIG. 7. Referring to FIG. 7, the variable height (c) of the fins 30 increases linearly with respect to the distance from the nozzle 50 to compensate for the lower heat transfer coefficient (h) away from the heat source. The rationale for this is that the local heat dissipation area (A) is proportional to the local fin height (c), therefore, as the local fin height (c) increases, so does the local heat dissipation area (A). The thermal conductance of the heat transfer surface between the heat sink 20 and the flow of cooling fluid 23 is simply the product of the heat transfer coefficient (h) and the heat dissipation area (A). Therefore, as the heat transfer coefficient (h) decreases with an increase in the distance (x) from the nozzle 50, the variable height (c) of the fins 30, and therefore the heat dissipation area (A), must increase to maintain a constant heat transfer rate. This can be better understood with the aid of the following relationship governing the heat dissipation rate ($\dot{q}$) from the surface area of the fins 30, defined by the equation:

$$\dot{q} = hA(T_s - T_\infty) \tag{2}$$

where "$T_s$" is the surface temperature of the fins 30, and "$T_\infty$" is the circumambient temperature of the cooling fluid 23.

As noted above, the heat transfer coefficient (h) varies linearly with respect to the distance (x) from the nozzle 50, and is defined by the equation:

$$h = h_i + \alpha(x - x_i) \tag{3}$$

where "$\alpha$" is a constant.

The surface area (A) related to the distance (x) from the nozzle 50 is represented by the equation:

$$A = \frac{1}{2}(c_i + c_o)(x - x_i). \tag{4}$$

Introducing Equations (3) and (4) into Equation (2), the following equation is obtained.

$$\dot{q} = \frac{1}{2}(c_i + c_o)(x - x_i)[h_i + \alpha(x - x_i)] \tag{5}$$

Specializing this relation for $x = x_o$, to cover the entire surface area of the fins 30 and solving the resulting equation for the constant "$\alpha$", the following equation is obtained.

$$\alpha = \frac{2\dot{q}}{(T_s - T_\infty)(c_i + c_o)(x_o - x_i)^2} - \frac{h_i}{(x_o - x_i)} \tag{6}$$

Introducing Equation (6) into Equation (3), we obtain the following relation for the variation of the heat transfer coefficient (h) with the distance (x) from the nozzle 50, which is defined by the equation:

$$h = h_i \left(\frac{x_o - x}{x_o - x_i}\right) + \frac{2\dot{q}}{(T_s - T_\infty)(c_i + c_o)(x_o - x_i)} \left(\frac{x - x_i}{x_o - x_i}\right). \tag{7}$$

Noting that the surface area (A) of the fin is expressible as $$A = \frac{1}{2}(c_i + c_o)(x_o - x_i) \tag{8}$$

Equation (7) can be manipulated to define the heat transfer coefficient (h) by the equation:

$$h = h_i \left(\frac{x_o - x}{x_o - x_i}\right) + \frac{\dot{q}}{A(T_s - T_\infty)} \left(\frac{x - x_i}{x_o - x_i}\right) \tag{9}$$

where "$h_i$" is the heat transfer coefficient at the first or second vertical walls 36, 38; and can be determined by the equation:

$$Nu_i = \frac{3.06 Re^n Pr^{0.42}}{(x_i/a) + (c_i/a) + 2.78} \tag{10}$$

where "$Nu_i$" is defined by the equation:

$$Nu_i = \frac{2h_i a}{k} \tag{11}$$

where "k" is the thermal conductivity of the impinging flow of cooling fluid 23. "Re" is defined by the equation:

$$Re = \frac{2\dot{m}}{\mu b} \tag{12}$$

where "$\dot{m}$" is the mass flow rate of the flow of cooling fluid 23, "$\mu$" is the dynamic viscosity of the cooling fluid 23. "Pr" is defined by the equation:

$$Pr = \frac{\mu c_p}{k} \tag{13}$$

where "$\mu$" is the dynamic viscosity of the cooling fluid 23, "$c_p$" is the isobaric specific heat of the cooling fluid 23, and "k" is the thermal conductivity of the cooling fluid 23.

The exponent (n) in Equation (10) is given by the equation $$n = \frac{(x_i/a) + 0.8(c_i/a) - 0.1}{1.44(x_i/a) + 1.15(c_i/a) + 4}. \quad (14)$$

The range of validity of Equation (10) is as follows:

$$\begin{cases} 3000 \leq \text{Re} \leq 90{,}000 \\ 4 \leq x_i/a \leq 50 \\ 4 \leq c_i/a \leq 20. \end{cases} \quad (15)$$

The height (c) of the fins 30 varies linearly with the distance (x) from the nozzle 50 and is defined by the equation:

$$c = \beta x \quad (16)$$

where "β" is a constant.

Applying Equation (16) to the inner $(x_i)$ and outer $(x_o)$ edges of the fins 30, the following relationship is obtained:

$$\frac{c_i}{c_o} = \frac{x_i}{x_o}. \quad (17)$$

Thus, knowing the distances $(x_i)$ and $(x_o)$ and one of the fin heights, say $(c_i)$ the other fin height $(c_o)$ can be determined from Equation (17).

From heat conduction considerations, the optimal height of the first and second vertical walls 36, 38 is defined by the equation:

$$c_i = \frac{0.6498t}{\sqrt{Bi_t}} \quad (18)$$

where "t" is the thickness of the fins 30, and "$Bi_t$" is a dimensionless quantity called the Biot number defined by the equation:

$$Bi_t = \frac{h_i t}{k_f} \quad (19)$$

where "$k_f$" is the thermal conductivity of the fin material. Therefore, knowing the heat transfer coefficient $(h_i)$ at the first or second vertical walls 36, 38 as described above, the optimum value of the height $(c_i)$ of the first or second vertical walls 36, 38 can be determined from Equations (18) and (19).

The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A cooling assembly for removing heat from an electronic device, said assembly comprising:
    a pump for circulating a flow of cooling fluid,
    a heat exchanger for removing heat from the flow of cooling fluid,
    a heat sink for transferring heat from the electronic device to the flow of cooling fluid and including a base plate for engaging the electronic device and having a top surface and a plurality of fins in spaced and parallel relationship extending upwardly from said top surface of said base plate a pre-determined height to a top extremity,
    a nozzle defining an exit for directing the flow of cooling fluid into said plurality of fins,
    said exit of said nozzle being disposed below said top extremity of said plurality of fins for discharging the flow of cooling fluid adjacent said top surface of said base plate, and
    wherein each fin of said plurality of fins includes an angled wall extending from a point proximate to the exit upwardly to said extremity at an acute angle to the base plate and diverging from said nozzle,
    wherein said heat sink includes a cap defining at least one outlet disposed above said top extremity of said plurality of fins for exhausting the flow of cooling fluid,
    wherein said plurality of fins defines a notch for receiving said nozzle such that said exit is below said top extremity, wherein said notch bisects said plurality of fins.

2. An assembly as set forth in claim 1 wherein said notch includes a first vertical wall and a second vertical wall in spaced relationship and perpendicular to said top surface of said base plate and extending upwardly from said top surface of said base plate to define a rectangular shape with said nozzle disposed therein.

3. An assembly as set forth in claim 2 wherein said notch includes a first angled wall extending upwardly from a first intersection with said first vertical wall to said top extremity and a second angled wall extending upwardly from a second intersection with said second vertical wall to said top extremity and diverging from said first angled wall, said first and second intersections disposed a pre-determined distance above said top surface of said base plate.

4. An assembly as set forth in claim 3 wherein said pre-determined distance $(c_i)$ between said first and second intersections and said top surface of said base plate is defined by $$c_i = \frac{0.6498t}{\sqrt{\dfrac{h_i t}{k_f}}}$$

where t is the thickness of the plurality of fins, $h_i$ is the heat transfer coefficient at the first and second vertical walls, and $k_f$ is the thermal conductivity of the material of the plurality of fins.

5. An assembly as set forth in claim 1 wherein said plurality of fins define a plurality of parallel flow channels therebetween and said exit includes at least one side opening in said nozzle for discharging the flow of cooling fluid into said plurality of parallel flow channels.

6. An assembly as set forth in claim 5 wherein said exit includes at least one basal opening in said nozzle for discharging the flow of cooling fluid perpendicularly onto said top surface of said base plate.

7. An assembly as set forth in claim 6 wherein said heat sink includes at least one pyramid fin extending upwardly from said top surface of said base plate and aligned with said at least one basal opening such that said at least one basal opening discharges the flow of cooling fluid onto said at least one pyramid fin.

8. An assembly as set forth in claim 6 wherein said nozzle includes a width (a), a length (b) and a hydraulic diameter ($d_h$) defined by the equation $$d_h = \frac{2ab}{a+b}.$$

9. An assembly as set forth in claim 8 wherein said hydraulic diameter ($d_h$) is in the range of $0.02 \text{ in} \leq d_h \leq 0.08 \text{ in}$.

10. An assembly as set forth in claim 9 wherein said assembly includes a spacing (s) between said top surface of said base plate and said nozzle in the range of $0.1 \leq s/d_h \leq 1$; where $d_h$ is the hydraulic diameter of the nozzle.

11. An assembly as set forth in claim 9 wherein said at least one side opening includes a diameter in the range of $0.2\sqrt{ab} \leq d \leq \sqrt{ab}$; where a is the width of said nozzle, and b is the length of said nozzle.

* * * * *